United States Patent [19]

Endoh et al.

[11] 4,187,477
[45] Feb. 5, 1980

[54] NOISE REDUCTION SYSTEM

[75] Inventors: Kenjiro Endoh; Motokazu Ohkawa, both of Yokohama; Kazuo Kitagawa, Kawasaki; Hideshi Kira, Yokohama, all of Japan

[73] Assignee: Tokyo Shibaura Electric Co., Ltd., Kawasaki, Japan

[21] Appl. No.: 844,435

[22] Filed: Oct. 21, 1977

[30] Foreign Application Priority Data

Oct. 21, 1976 [JP] Japan .................. 51-126565

[51] Int. Cl.$^2$ ............................................ H04B 1/64
[52] U.S. Cl. ............................. 333/14; 307/264; 328/168; 330/126; 330/295; 325/62
[58] Field of Search .................. 333/14; 307/264; 328/168, 169, 172; 325/62, 65; 330/126, 295; 179/1 P, 1 VL

[56] References Cited

U.S. PATENT DOCUMENTS

| | | | |
|---|---|---|---|
| 3,757,254 | 9/1973 | Takahashi et al. | 333/14 |
| 3,795,876 | 3/1974 | Takahashi et al. | 333/14 |
| 3,989,897 | 11/1976 | Carver | 325/65 X |

*Primary Examiner*—Paul L. Gensler
*Attorney, Agent, or Firm*—Oblon, Fisher, Spivak, McClelland & Maier

[57] ABSTRACT

A noise reduction system including an encoder for compressing the dynamic range of an audio input signal in accordance with the amplitude thereof, a transmission medium coupled to the encoder, and a decoder having a transfer function inverse to that of the decoder. The encoder includes a first controlled amplifier circuit in which, when the input audio signal is in low- and middle- levels, sufficient emphasis is made to the signal at high frequencies, and when it is in high-level, the emphasis quantity at high frequencies is restrictive. The decoder includes a voltage-current converting circuit for converting voltage of the reproduced audio signal into current and a second controlled amplifier circuit amplifying the converted current and having a transfer function inverse to that of the first controlled amplifier circuit. The second controlled amplifier includes a variable response amplifier having a capacitor and a resistor in series circuit between the output of the voltage-current converting circuit and the output terminal of the second voltage controlled amplifier, a variable gain current amplifier connected at the input thereof to the output of the voltage-current converting circuit and the series circuit, and means for converting the output current of the variable gain current amplifier into a voltage to be directed to the decoder output terminal.

8 Claims, 17 Drawing Figures

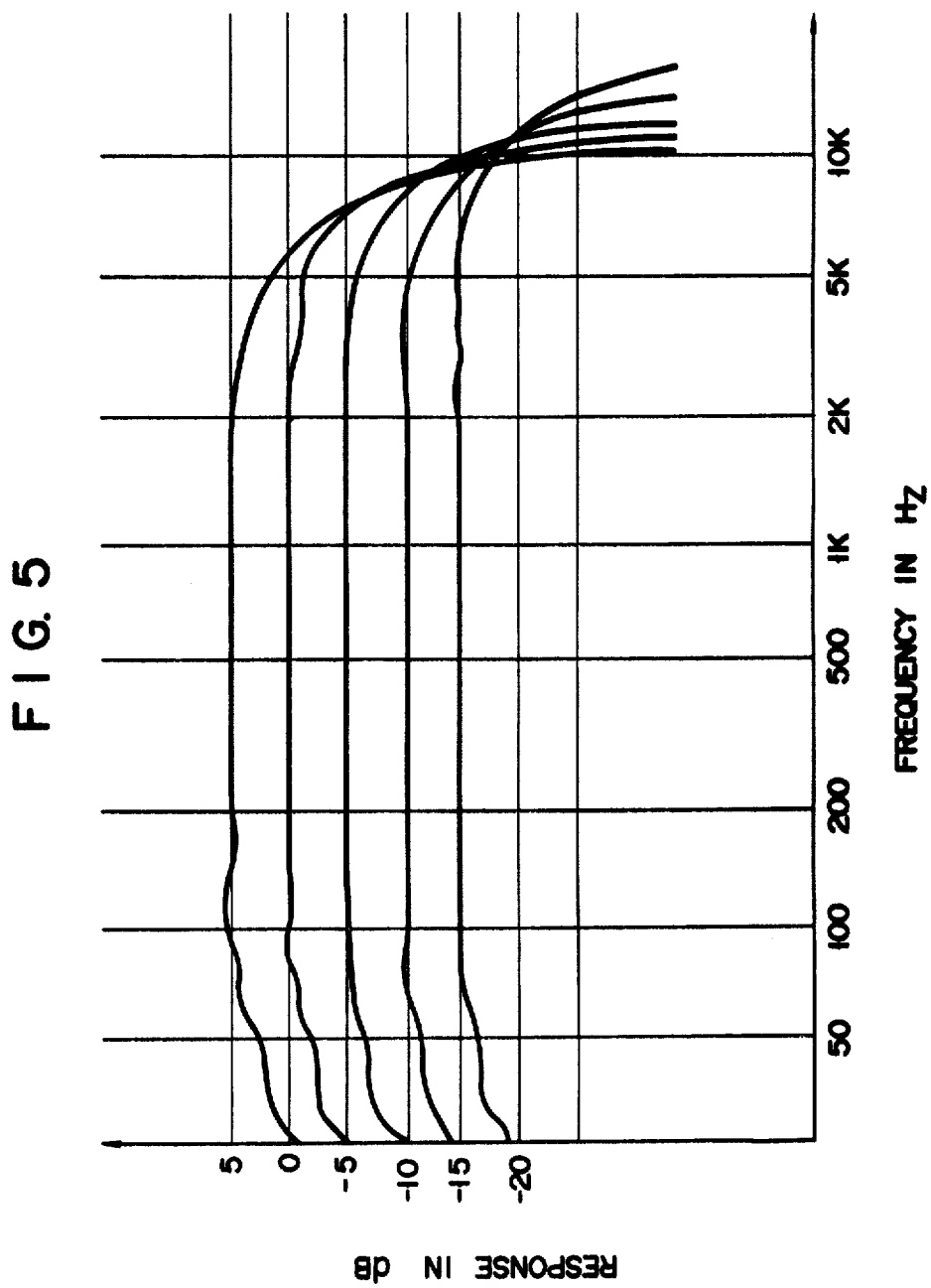

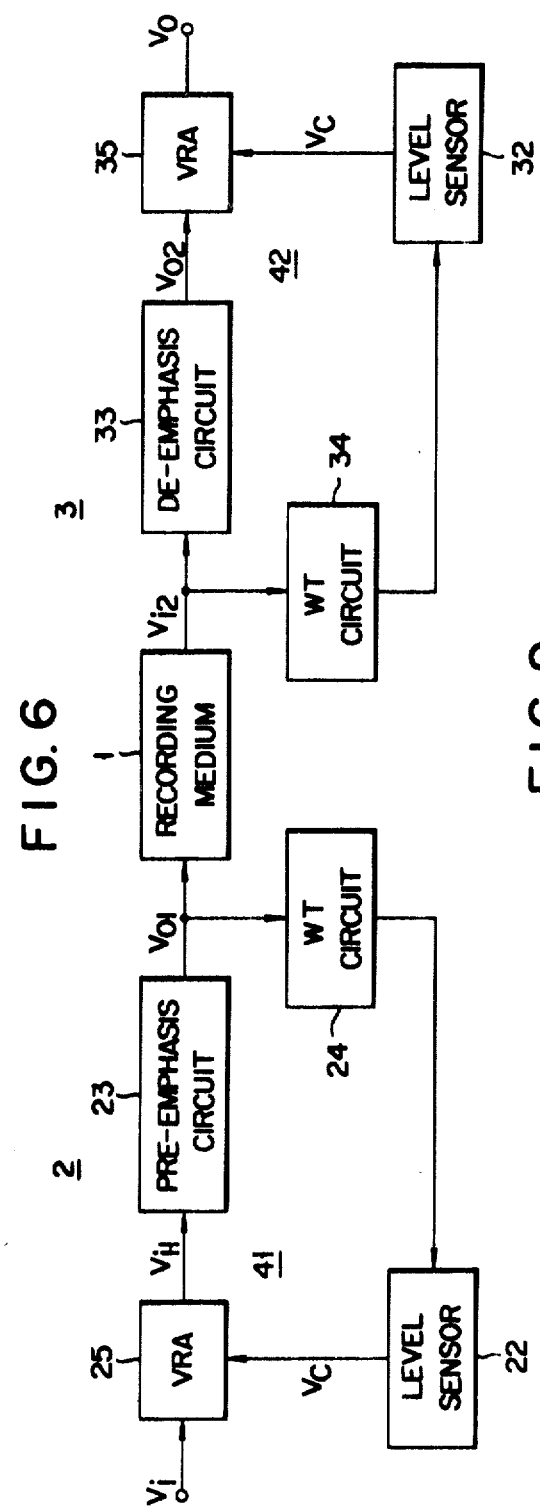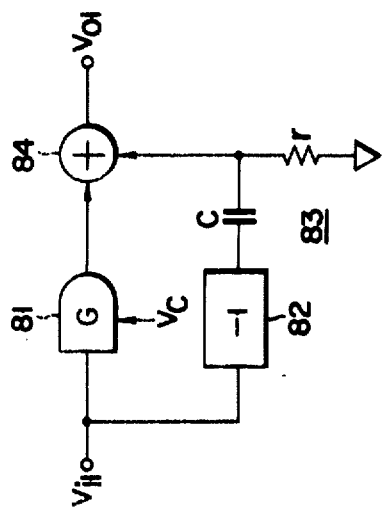

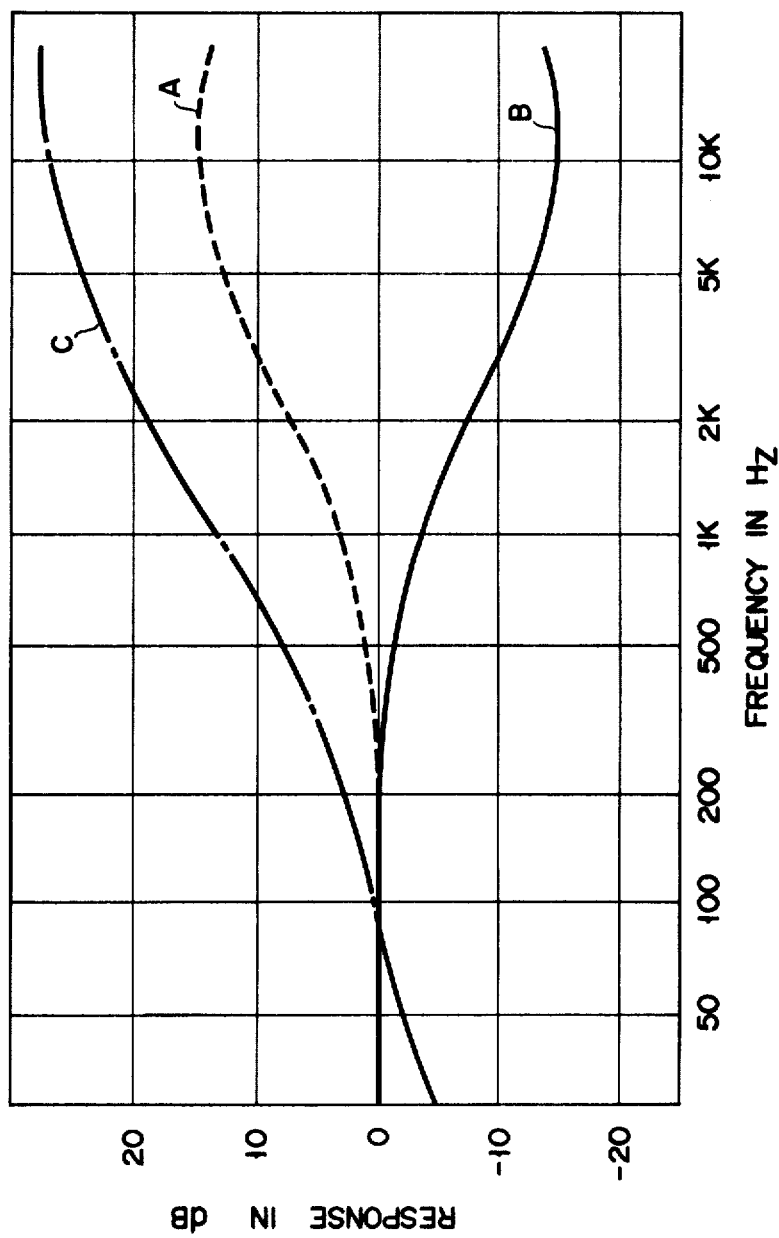

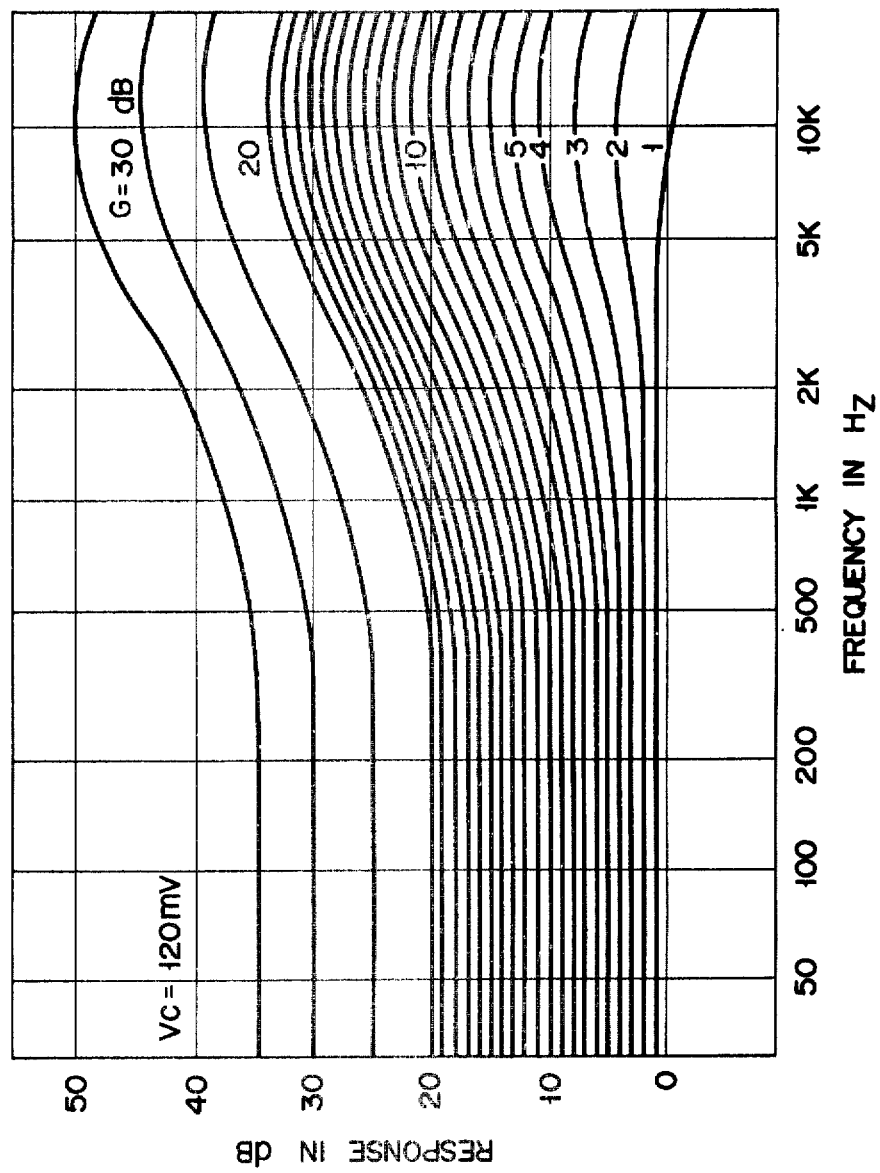

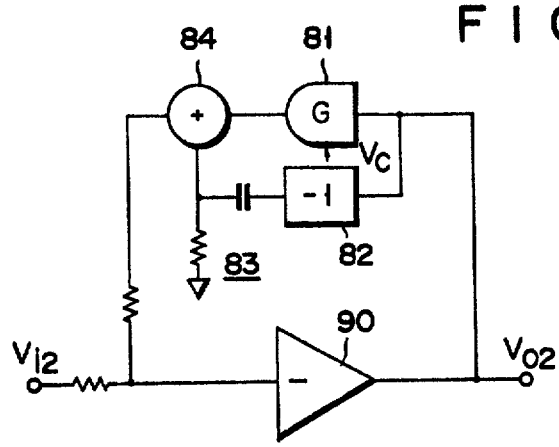
FIG. 13
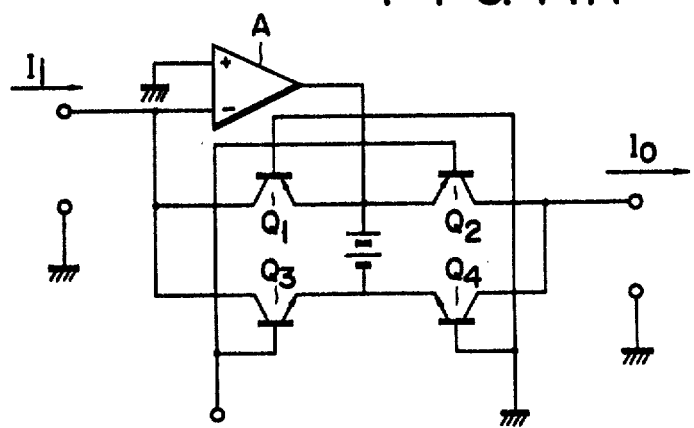
FIG. 14A
FIG. 14B
FIG. 16   FIG. 15
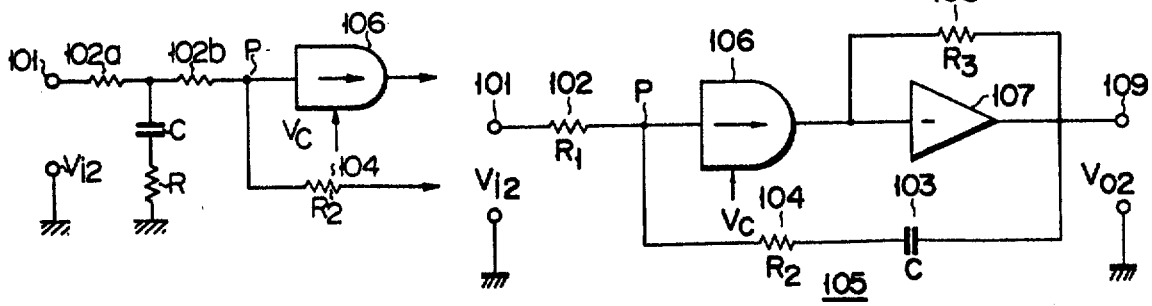

NOISE REDUCTION SYSTEM

BACKGROUND OF THE INVENTION

The invention relates to a system for reducing noise of recording mediums or transmission mediums and, more particularly, a noise reduction system suitable for reducing noise of sound signal recording/reproducing apparatuses such as tape-recorders.

In application of the noise reduction system to a transmission system treating the sound of high quality (including recording/reproducing system), so far as the S/N improvement of the system is not so good, the modulation of noise level is not noticeable. On the other hand, in the system with highly improved S/N, the noise level modulation is not negligible. Particularly, when it is applied to a transmission system with poor S/N, the noise level modulation is remarkable and it is practically problematic in some of sound sources.

This will be detailed by using a conventional noise reduction system with highly improved S/N with reference to FIGS. 1 and 2.

Referring now to FIG. 1, there is shown a conventional noise reduction system comprising an encoder 2 which is used in recording operation and serves as a means for compressing the dynamic range of an analogue information signal, and a recording medium (or transmission medium) 1 such as tape-recorders connected at the input to the encoder 2, and a decoder 3 which is used in reproducing operation as a means for expanding the compressed signal to the original dynamic range of the signal, being connected at the output of the recording medium 1.

A voltage controlled amplifier 21 of the encoder 2 and a voltage controlled amplifier 31 of the decoder 3 each serve as a kind of multiplier. When receiving an input signal $e_i$ and a DC level E, it produces an output signal $e_o$ expressed by:

$$e_o = E^{\pm 1} \times e_i \tag{1}$$

In the equation (1), the figure of E takes minus sign in encoding operation while it takes plus sign in decoding operation.

A level sensor 22 of the encoder 2 and another level sensor 32 of the decoder 3 are used to detect signal level and each of the sensors 22, 32 produces the DC level E corresponding to the level of the input signal e.

Thus, if the signal $e_i$ is applied to the encoder 2, the encoder 2 produces an output signal (an input signal directed to the recording medium 1) $e_{o1}$ is given:

$$e_{o1} = E_{o1}^{-1} \times e_{i1} \tag{2}$$

For level expression of the signal in the equation (2), one can rewrite it to give:

$$E_{o1} = E_{o1}^{-1} \times E_{i1} \tag{3}$$

Therefore, we obtain:

$$E_{o1} = E_{i1}^{\frac{1}{2}} \tag{4}$$

This shows that level change of the signal in encoding is compressed to ½ in the logarithmic scale.

When an output signal $e_{i2}$ is applied to the recording medium 1, the output signal $e_{o2}$ of the decoder 3 is given:

$$e_{o2} = E_{i2} \times e_{i2} \tag{5}$$

The level expression of the signal shown in the equation (5) is:

$$E_{o2} = E_{i2} \times E_{i2} \tag{6}$$

Hence $$E_{o2} = E_{i2}^2 \tag{7}$$

This means that the level change of the signal in decoding is expanded double in logarithmic scale.

FIG. 2 shows operation characteristics of the above-mentioned noise reduction system. The compression operation of the encoder 2 operating in recording operation traces a line A. For example, the +20 dB input signal is recorded with compression of +10 dB, thus improving the peak margin. Further, the −60 dB input signal is compressed to −30 dB. Thus, the input signal is recorded with the dynamic range thereof compressed half as a whole.

The expanding operation of the decoder 3 operating in the reproduction is defined by a curve B. The signal of +10 dB recorded in the recording medium 1 is expanded to the original +20 dB. The signal of −30 dB recorded is reduced to −60 dB, as shown in the figure. Note here that, at this time, noise is also reduced by 30 dB. The −60 dB signal inputted to the encoder 2 is improved of its S/N by 30 dB.

Accordingly, the improvement of S/N of the noise reduction system is generally expressed by $-\frac{1}{2} \times$ (input signal level (dB)).

In this noise reduction system, in the input signal of −100 dB, its S/N improvement reaches 50 dB so that little noise is reproduced. On the other hand, the 0 dB input signal has the S/N improvement of 0 dB. In this manner, noise is modulated in accordance with change of the loudness of the sound source.

Generally, a great loudness of the sound source masks noise so that the noise modulation is not problematic. But, in the sound with relatively simple harmonics such as piano solo, noise is insufficiently masked. In this case, the level of noise changes with rhythm of the sound source. When the noise level changes greatly, it more stimulates auditory sensation level than when noise with a fixed level appears.

One of the known schemes to remove such a defect is shown in FIG. 3. Briefly, the scheme employs a de-emphasis circuit 33 with the characteristic indicated by a curve B in FIG. 4. The de-emphasis circuit 33 is used to reduce the gain in the region including much noise of high-frequencies to forcibly suppress the noise itself. The use of the de-emphasis circuit, however, attenuates the musical sound in the high-frequency range. For this reason, it is necessary to use a pre-emphasis circuit 23 with characteristic indicated by a curve A and related in inverse-function to that of the de-emphasis circuit. The emphasis at high-frequencies when it is encoded, reduces the peak margin against the saturation level of the recording medium, thus possibly resulting in distortion of high-frequencies. Therefore, the sensitivity of the level sensor must be heightened at high-frequencies in order to more greatly compress it. For this, weighting circuits 24 and 34 with characteristic indicated by a curve C in FIG. 4, are used.

In the case of recording mediums with high noise level, low saturation level and narrow band width, such as compact cassette tapes, the application of this scheme to it is not advisable. Particularly, in the sound source with simple spectrum construction, the noise modulation is remarkable and further when the spectrum envelope is high level over all the frequency range, the signal at high-frequencies is not reproduced due to saturation in the high-frequency range so that the reproduced sound is not clear with poor spacial distribution of sound. FIG. 5 shows recording/reproducing frequency characteristics of one compact cassette tape-recorder. This indicates that the characteristic at high-frequencies more deteriorates as the level of signal is higher. In other words, when musical sound, even if it is not encoded, is recorded at high level, its sound quality is deteriorated due to the fact that the high-frequency range is not reproduced. When encoded signal of which the high-frequency range is emphasized is recorded, this deterioration of the sound quality is more remarkable.

SUMMARY OF THE INVENTION

Accordingly, the primary object of the invention is to provide a noise reduction system with a simple construction which may be stably operable without deteriorating of sound quality, even when it is used in compact cassette tape-recorders.

According to the invention, there is provided a noise reduction system having an encoder for compressing the dynamic range of an input signal in accordance with the amplitude thereof and for delivering the compressed one to a signal transmission medium, and a decoder for expanding the dynamic range of an output signal of a signal transmission medium in accordance with the amplitude thereof, the noise reduction system comprising: a first controlled amplifier circuit provided in the encoder in which, when the input signal is in the low- and middle-level, the high-frequency range of the signal is sufficiently emphasized and, when the signal is high, the emphasis quantity in the high-frequency range is restrictive; and the decoder including a voltage-current converting circuit for converting the voltage of the reproduced audio signal into current and a second controlled amplifier circuit having a transfer function related to that of the first controlled amplifier circuit substantially in inverse-function manner, the second controlled amplifier having a variable response amplifier including a series circuit including a capacitor and a resistor and connected at one end to the output of the voltage-current converting circuit and at the other end to an output terminal, a current amplifier with variable gain for amplifying current flowing through the connection point between the voltage-current converting circuit and the series circuit, and means for converting the output current of the current amplifier into voltage to be directed to the output terminal.

Other objects and features of the invention will be apparent from the following description taken in connection with accompanying drawings, in which:

BRIEF DESCRIPTION OF THE DRAWINGS

FIG. 5 shows one of recording/reproducting frequency characteristics of cassette tape-recorders generally used;

FIG. 6 shows a block diagram of a whole noise reduction system according to the present invention;

FIG. 7 shows characteristic curves illustrating the operations of the respective portions of the noise reduction system shown in FIG. 6;

FIG. 8 shows a graph of the frequency response characteristic curves of the controlled amplifier of the encoder shown in FIG. 6;

FIG. 9 shows one form of variable response amplifiers available for the encoder in FIG. 6;

FIG. 13 is a circuit diagram of an example of the variable response amplifier in the decoder in FIG. 6;

FIG. 14A is a circuit diagram of an example of a current amplifier with variable gain controlled by control voltage;

FIG. 14B shows a symbol indicating the circuit shown in FIG. 14A;

FIG. 15 shows a circuit diagram of the variable response amplifier and a voltage-current converting circuit in the decoder shown in FIG. 6 according to the present invention; and FIG. 16 shows another example of the voltage-current converting circuit shown in FIG. 15.

DETAILED DESCRIPTION OF THE PREFERRED EMBODIMENTS

Figure 1:
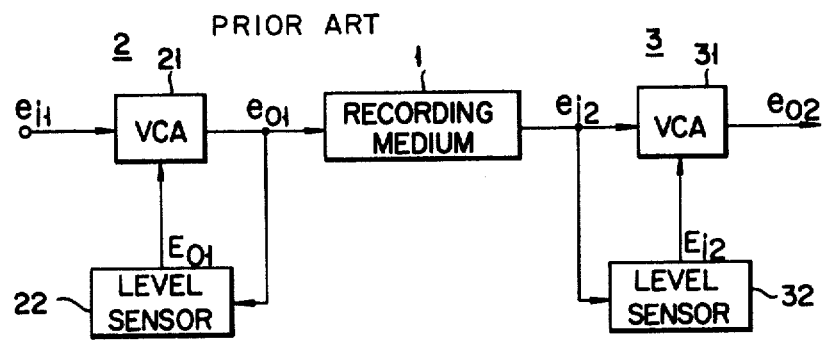
FIG. 1 shows a block diagram of a conventional noise reduction system.
Figure 2:
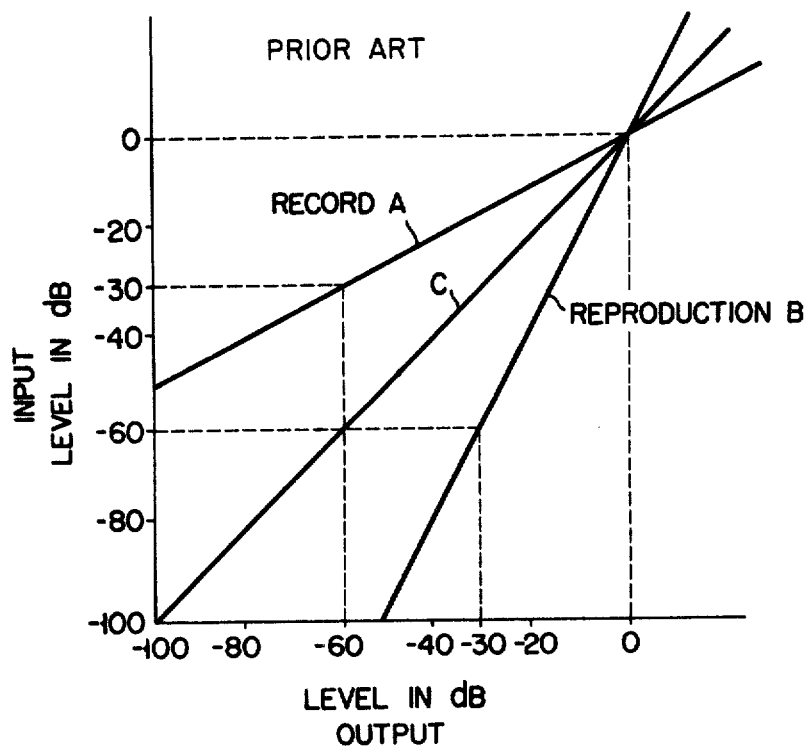
FIG. 2 shows operational characteristic curves of the noise reduction system shown in FIG. 1.
Figure 3:
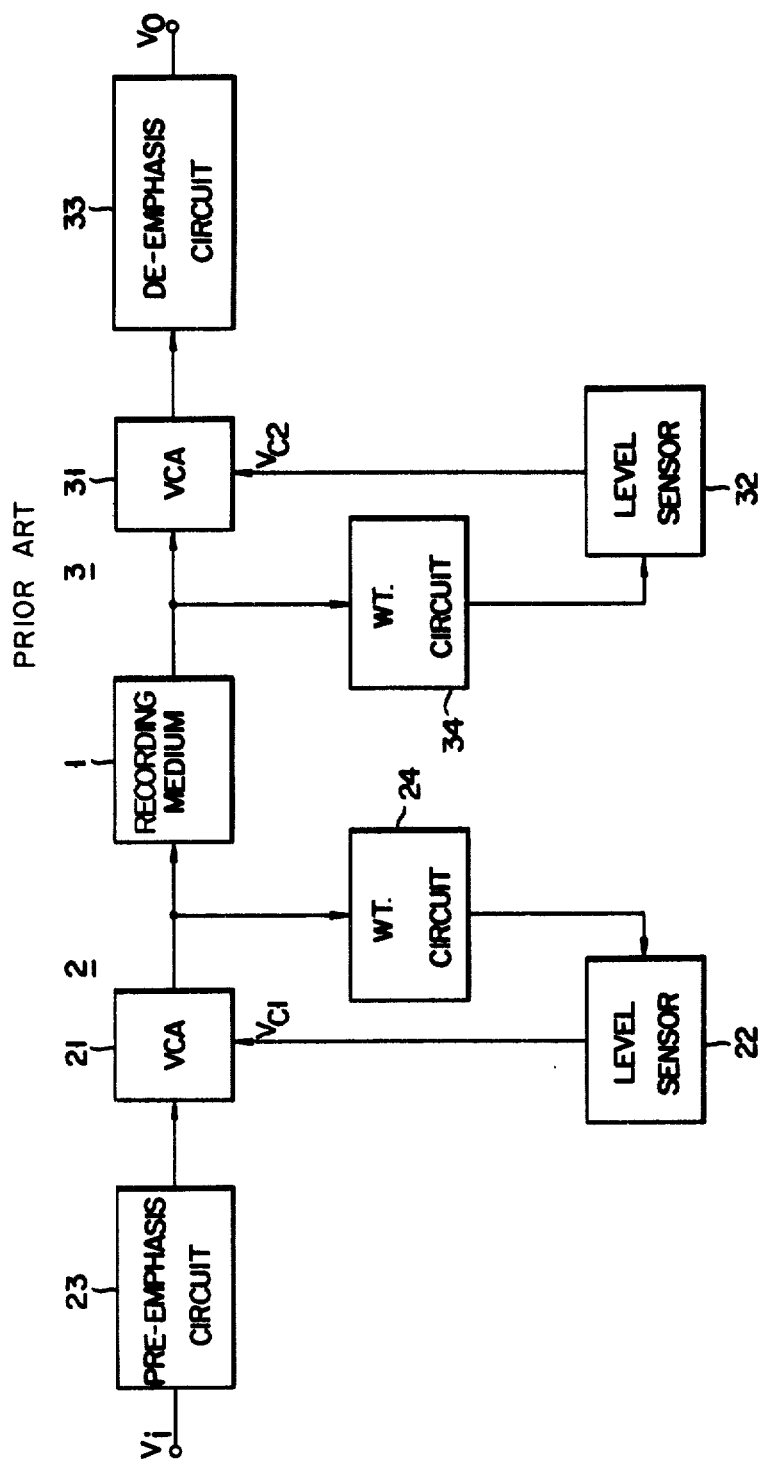
FIG. 3 shows a block diagram of another improved conventional noise reduction system.
Figure 4:
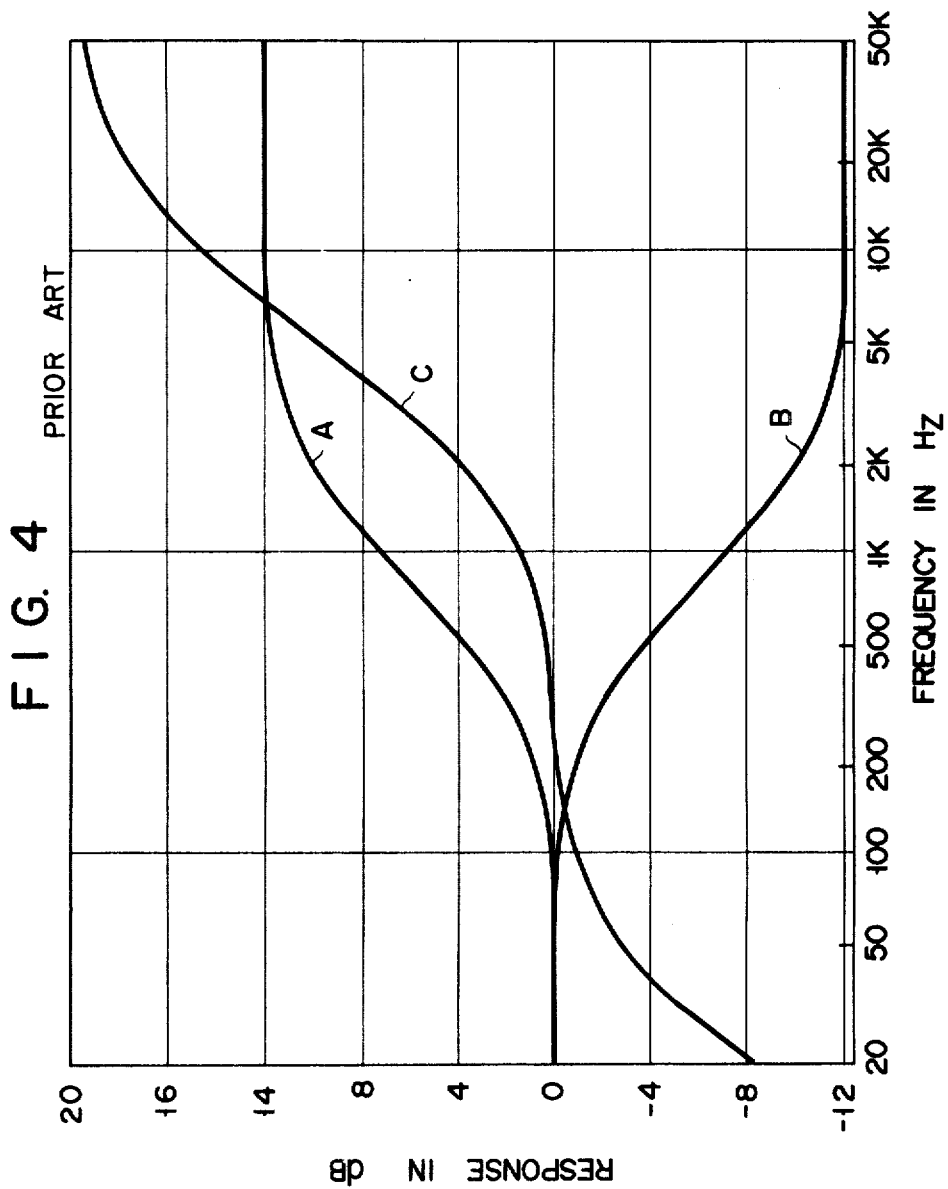
FIG. 4 shows characteristic curves illustrating the operations of respective portions of the noise reduction system shown in FIG. 3.

Referring now to FIG. 6, there is shown a noise reduction system according to the invention. In the figure, the basic constructions of level sensors 22 and 32, a high-frequency pre-emphasis circuit 23, a high-frequency de-emphasis circuit 33, weighting circuits 24 and 34, and a recording medium (or a transmission medium) 1 are the same as those in FIG. 3. But the frequency-response characteristics of the encoder 2, decoder 3 and the weighting circuits 24, 34 are slightly different from those of circuits shown in 3 and are shown in FIG. 7. The output signals of the level sensors 22 and 32 are applied to the variable response amplifiers 25 and 35, respectively, to control simultaneously characteristics of gain and frequency.

FIG. 8 shows an overall frequency characteristics of the controlled amplifier of the encoder 2 including the high-frequency pre-emphasis circuit 23 and the variable response amplifier 25. As seen from the graph, when gain G of a voltage controlled amplifier (VCA) of the variable response amplifier 25 becomes small (the control voltage $V_c$ is at low potential), the gain over the entire the frequency range is reduced. In this case, the gain at high-frequencies considerably reduces as compared to that at other frequencies so that the amount of the emphasis at high-frequencies becomes small. On the other hand, when the gain G of the VCA becomes large (the control voltage $V_c$ is at high potential), the gain over the entire the frequency range increases and the gain at high-frequency range considerably increases as compared with the other frequency range and the amount of emphasis gets large. The variable response amplifier 35 in the decoder 3 has a transfer function which is substantially an inverse-function of that of the variable response amplifier 25 in the encoder 2.

The circuit construction shown in FIG. 6 uses the level sensors each operable in such a manner that, when the input level is high, it produces low voltage and vice versa. With such a construction, an input signal $V_i$ is applied to the encoder 2 and when its level is low, it is amplified by the controlled amplifier 41 consisting of the variable response amplifier 25 and the pre-emphasis circuit 23, and the high-frequency range of it is emphasized. This signal passes through the transmission medium 1 where noise is incorporated. The signal with the noise is then transferred to the decoder 3 of which the transfer function is substantially an inverse-function of that of the encoder 2. In the decoder 3, the controlled amplifier 42 having the variable response amplifier 35 and the de-emphasis circuit 33 reduces the level of the signal, particularly de-emphasizing it in the high-frequency range. This is followed by reduction of noise level, as in the conventional case. It is to be noted, however, that, if the emphasis quantity is sufficiently large at high-frequencies, the degree of the noise compression is large and thus the noise modulation is suppressed not to reach the auditory sensation level.

When the input level is high, it is attenuated by the controlled amplifier 41 to enlarge the peak margin, as in the conventional case. Note here that reducing of pre-emphasis of high-frequency range further enlarges the peak margin at high-frequencies. As a matter of course, the pre-emphasized signal by reduced emphasizing characteristic at high-frequencies is compensated when it is decoded.

It will be understood that the controlled amplifier 41 of the encoder 2 is not limited in characteristic to that shown in FIG. 8. It may be satisfied with a characteristic that, when the gain is changed corresponding to change of the output $V_c$ of the level sensor, the emphasis quantity at high-frequencies when the gain is small is less than when it is large.

The explanation to follow is the details of the noise reduction system mentioned above. FIG. 9 shows an example of the variable response amplifier 25 used in the encoder 2, including a voltage controlled amplifier 81, an inversion amplifier 82, and a high-pass filter 83. The VCA 81 is such an amplifier that its gain G changes depending on the control voltage $V_c$ with a flat frequency characteristic. An adder 84 adds the output of the VCA 81 to the output of the inversion amplifier 82 after passing through the high-pass filter 83. With designation G of gain of the VCA 81, a transfer function $H_e(\omega)$ between $V_{i1}$ and $V_{o1}$ is:

$$H_e(\omega) = \frac{V_{ol}}{V_{il}} = G - \frac{Scr}{1 + Scr} \tag{8}$$

$$S = j\omega$$

where

ω: angular frequency
c: capacitance value of high-pass filter 83
r: resistance value of high-pass filter 83

Figure 10:
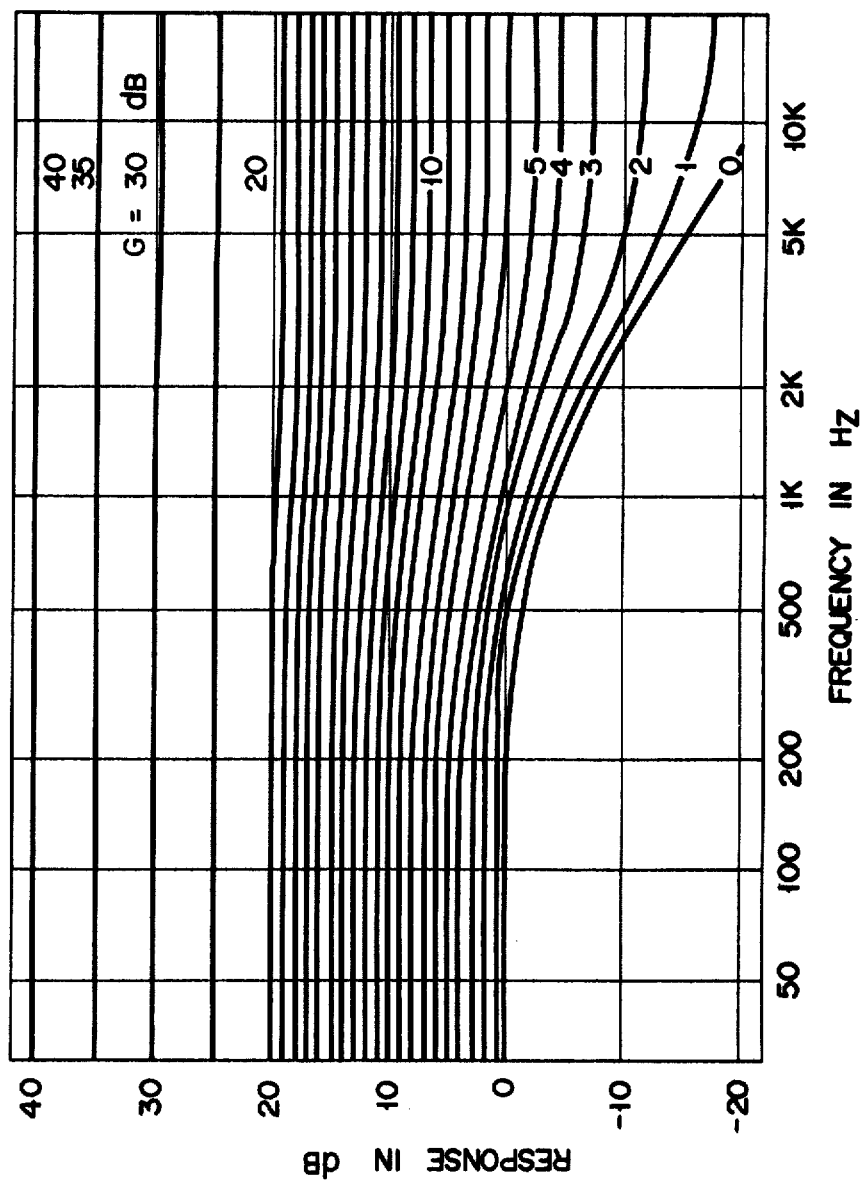
FIG. 10 shows the frequency response characteristics of the variable response amplifier shown in FIG. 9.

The frequency-response characteristics of the variable response amplifier 25 within the range $G \geq 1$ is shown in FIG. 10. Therefore, if the variable response amplifier 25 and the high-frequency pre-emphasis circuit 23 with the characteristic indicated by a curve A in FIG. 7 are connected in series, the characteristics as shown in FIG. 8 can be obtained.

Figure 11:
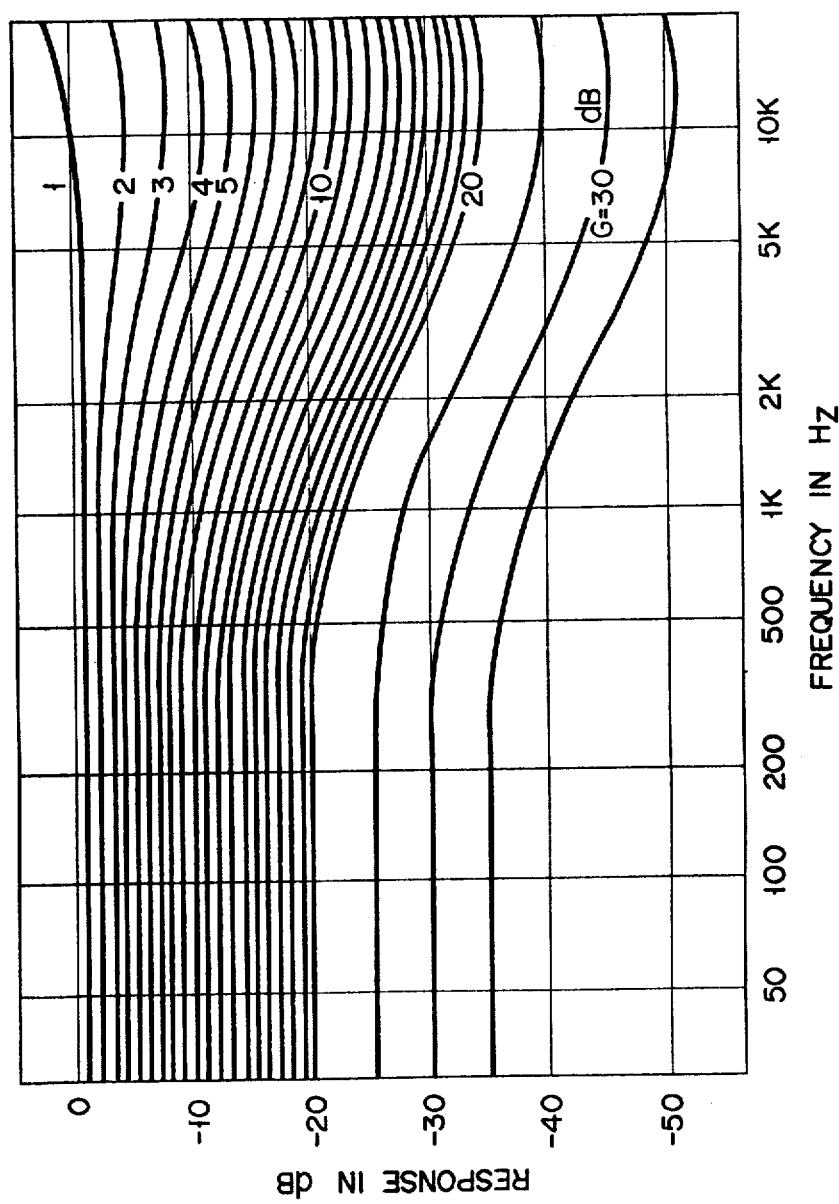
FIG. 11 shows a frequency response characteristics of the controlled amplifier of the decoder shown in FIG. 6.
Figure 12:
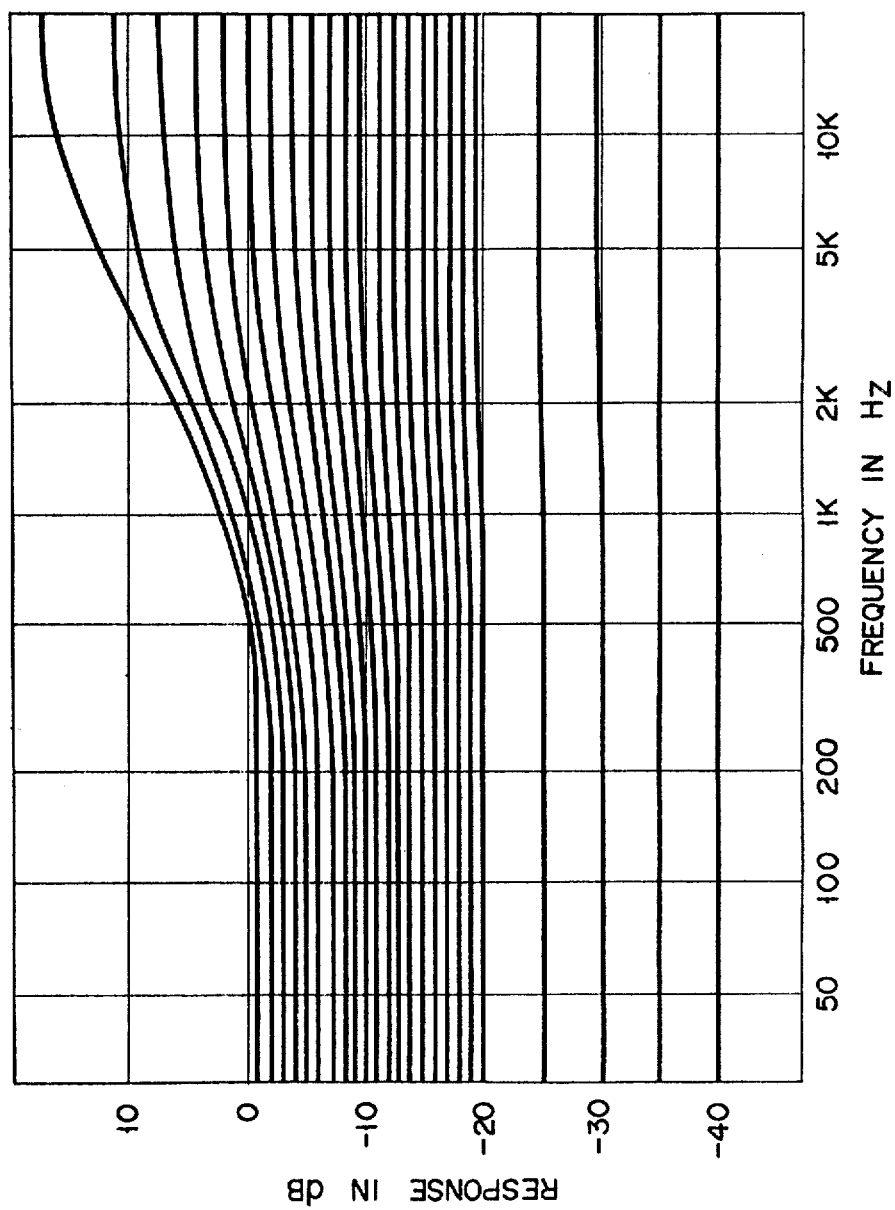
FIG. 12 shows a frequency response characteristics of a variable response amplifier used in the decoder.

The overall frequency-response characteristics of the controlled amplifier 42 in the decoder 3 may be ones which are in contrast with those of the encoder 2 as shown in FIG. 8. The overall frequency-response characteristic of the controlled amplifier 42 is shown in FIG. 11. This is realized by using the variable response amplifier 35 with a transfer function $H_d(\omega)$ which is a reciprocal of the equation (8). FIG. 12 shows the frequency-response characteristics of the thus constructed variable response amplifier 35 within the range of $G \geq 1$. One of the ways for obtaining such the transfer function is that a function circuit with the same transfer function as of the variable response amplifier 25 used in the encoder 2 is inserted in a negative feedback path of an operational amplifier. More precisely, as shown in FIG. 13, the circuit portion including the VCA 81, the inversion amplifier circuit 82, the high-pass filter 83, and the adder 84, shown in FIG. 9, is inserted in the negative feedback path of the operational amplifier 90. In this case, the high-frequency de-emphasis circuit 33 must be of course related in inverse function manner to the high-frequency pre-emphasis circuit 23.

However, the circuit construction as shown in FIG. 13 with the voltage controlled amplifier 81 connected in the negative feedback circuit of the operational amplifier 90 has the feedback ratio of 1 or more so that the circuit is instable to oscillate in most cases.

The input and output signals of the variable response amplifier 35 shown in FIG. 13 are expressed in terms of voltage. That is, the input impedance of each block is infinite while the output impedance thereof is 0. Accordingly, if the VCA 81 is constructed by a current amplifier of the type to control signal current by the control voltage $V_c$, it is necessary to use a circuit (comprised of an operational amplifier) to convert the output current into voltage. The circuit shown in FIG. 13 further needs other operational amplifiers for the inversion amplifier 82 and the adder 84, in addition to the operational amplifier 90. This results in complexity of the variable response amplifier 35 circuit.

In the invention directed to overcome such defects, the variable response amplifier 35 of the decoder 3 is constructed without inserting the VCA in the negative feedback path of an operational amplifier and it is operated in current mode. An example shown in FIG. 14A is the VCA comprising a current amplifier of the type to control signal current. Such a VCA is well known from, for example, U.S. Pat. No. 3,714,462 and thus details of it will be omitted. In the circuit of FIG. 14A, if the characteristic of four transistors $Q_1$ to $Q_4$ are much the same, the input current $I_i$ and the output current $I_o$ are related in the following:

$$I_o = -I_i \times EXP((V_c + V_b)/V_T) \tag{9}$$

where
$V_T = kT/q$
$V_b$: bias voltage
$V_c$: control voltage The VCA will be hereinafter represented by a symbol as shown in FIG. 14B.

FIG. 15 shows a circuit diagram of the variable response amplifier 35 of one embodiment of this invention used in the decoder 3 and constructed by such a VCA and a voltage-current converting circuit connected at an input of the amplifier 35. A reproduced analogue information signal voltage $V_{i2}$ to be applied to an input terminal 101 is converted by a first resistor 102 of the voltage-current converting circuit (of which the resistance is $R_1$) into current $I_1$ given by an equation (10):

$$I_1 = V_{i2}/R_1 \qquad (10)$$

The output voltage $V_{o2}$ of the output terminal 109 is converted by a series circuit including a capacitor 103 and a second resistor 104 into current $I_2$ to be given by an equation (11):

$$I_2 = \frac{j\omega c V_{o2}}{1 + j\omega c R_2} \qquad (11)$$

The other end of the series circuit 105 is connected at the other end to the other end of the first resistor 102. Current $(I_1 + I_2)$ flowing through this connection point P is fed to the VCA 106. Therefore, current $I_3$ appears at the output of the VCA 106 and it is the product of the current $(I_1 + I_2)$ and the gain (current amplification factor) $G_o$ expressed by an equation (12) controlled by the control voltage $V_c$.

$$G_o = -EXP((V_c + V_b)/V_T) \qquad (12)$$

$$I_3 = (I_1 + I_2)G_o \qquad (13)$$
$$= (\frac{V_{i2}}{R_1} + \frac{j\omega c V_{o2}}{1 + j\omega c R_2}) \cdot EXP((V_c + V_b)/V_T)$$

The output current $I_3$ of the VCA 106 is converted into voltage by a circuit including an operational amplifier 107 and a resistor 108 (of resistance $R_3$). The output terminal 109 produces an output voltage $V_{o2}$ given by the following equation:

$$V_{o2} = R_3 \cdot I_3 \qquad (14)$$
$$= R_3(\frac{V_{i2}}{R_1} + \frac{j\omega c V_{o2}}{1 + j\omega c R_2}) \cdot EXP((V_c + V_b)/V_T)$$

Therefore, the relation of the input to output voltages $V_{i2}$ and $V_{o2}$, i.e. the transfer function $H_d(\omega)$ of the variable response amplifier 35 shown in FIG. 15 is:

$$\frac{V_{o2}}{V_{i2}} = H_d(\omega) = \qquad (15)$$
$$\frac{1}{R_1(\frac{EXP(-(V_c + V_b)/V_T)}{R_3} - \frac{j\omega c}{1 + j\omega c R_2})}$$

When substituting the following equations (16) and (17) into the equation (15), we rewrite the equation (15) in the form of an equation (18):

$$\frac{R_1}{R_3} \cdot EXP(-(V_c + V_b)/V_T) = G \qquad (16)$$
$$R_1 = R_2 = r \qquad (17)$$
$$\frac{V_{o2}}{V_{i2}} = \frac{1}{G - \frac{Scr}{1 + Scr}} \qquad (18)$$

As will be understood, the equation (18) is an inverse-function of the equation (8) representing the transfer function $H_e(\omega)$ of the variable response amplifier 25 used in the encoder 2. The graphical illustration of the FIG. 15 of the variable response amplifier 35 characteristic is shown in FIG. 12.

In the circuit just mentioned, if the gain of the VCA 106 is controlled within the range that the feedback amount by the series circuit 105 is below 1, the instability found in the circuit shown in FIG. 15 is completely removed to successfully suppress occurrence of oscillation.

Additionally, the above-mentioned circuit construction eliminates the need of the operational amplifier 90 shown in FIG. 13. The FIG. 15 circuit is so constructed that output currents from the resistor 102 and the series circuit 105 including the capacitor 103 and the resistor 104 are summed in the form of current and the output current of the VCA 106 receiving the summed current is converted by the circuit comprising the operational amplifier 107 and the resistor 108. That is, the characteristic of the variable response amplifier 35 used in the decoder 3, shown in FIG. 12 is obtained with such a circuit construction. Therefore, the adder 84 for voltage addition shown in FIG. 13 also is deleted in the circuit of FIG. 15. Thus, the number of devices such as an operational amplifier and an adder is considerably reduced as compared with those of the FIG. 15 circuit, resulting in simplification of the circuit construction.

The voltage-current converting circuit shown in FIG. 15 only has the resistor 102 and the frequency-response characteristic of the resistor is constant. But a voltage-current converting circuit having a variable frequency-response characteristic may be used. The circuit shown in FIG. 16 shows one example of a voltage-current converting circuit with a variable frequency-response characteristic.

The circuit shown in FIG. 16 is a T type four-terminal circuit having a first series circuit consisting of resistors 102a, 102b connected between the input terminal 101 and the node P and a second series circuit consisting of a capacitor C and a resistor R connected between the junction of the resistors 102a, 102b and the ground. Due to the presence of the capacitor C, the amount of current flowing into the node P from the resistor 102b increases in the high frequency range of the voltage $V_{i2}$.

As described above, there is eliminated deterioration of sound quality when the noise reduction system of the invention is applied to compact cassette tape-recorder, along with ensuring stability of operation and cost reduction of its being simplicity of circuit construction.

Various other modifications of the disclosed embodiments will be apparent to person skilled in the art without departing from the spirit and scope of the invention as defined by the appended claims.

What we claim is:

1. A noise reduction system having an encoder for compressing the dynamic range of an audio input signal in accordance with the amplitude thereof and for delivering the compressed audio signal to a signal transmission medium, and a decoder for expanding the dynamic range of an audio signal reproduced from the signal transmission medium in accordance with the amplitude thereof, said noise reduction system comprising: a first controlled amplifier circuit provided in the encoder in which, when the input signal is in the low- and middle-level, the high-frequency range of the signal is sufficiently emphasized and, when the signal is high, the emphasis quantity in the high-frequency range is restrictive; and the decoder including a second controlled amplifier circuit having a transfer function related to that of said first controlled amplifier circuit substantially in inverse-function manner; said second controlled amplifier including a voltage-current converting circuit for converting the voltage of the reproduced audio signal into current and a first variable response amplifier having a series circuit including a capacitor and a resistor connected at one end to the output of the voltage-current converting circuit and at the other end to the output terminal of the variable response amplifier, a current amplifier with variable gain for amplifying current obtained from the connection point between said voltage-current converting circuit and said series circuit, and a current-voltage converting circuit for converting the output current of said current amplifier into voltage to be directed to the output terminal of the decoder through the output terminal of the first variable response amplifier.

2. A noise reduction system according to claim 1, in which said voltage-current converting circuit includes a resistor connected between the input terminal of the decoder and the connection point.

3. A noise reduction system according to claim 1, in which said voltage-current converting circuit includes a four-terminal circuit with a de-emphasized frequency-response characteristic in the high frequency range of the operational audio band.

4. A noise reduction system according to claim 1, in which said current-voltage converting circuit includes an operational amplifier whose input is connected with the output of said current amplifier, and a negative feedback resistor connected between the input and output of said operational amplifier, and in which the other end of said series circuit is connected to the output terminal of said operational amplifier.

5. A noise reduction system according to claim 1, in which said first controlled amplifier circuit includes a pre-emphasis circuit for emphasizing the audio input signal at high-frequencies.

6. A noise reduction system according to claim 5, in which said first controlled amplifier circuit includes a second variable response amplifier the output signal of which is applied to the input of said pre-emphasis circuit, a weighting circuit for weighting by a predetermined amount the output of said pre-emphasis circuit amplifier, and a level sensor for applying a control voltage corresponding to the output level of said weighting circuit to a control voltage input terminal of said second variable response amplifier.

7. A noise reduction system according to claim 1, in which said decoder includes a de-emphasis circuit for de-emphasizing an output analogue signal of said signal transmission medium.

8. A noise reduction system according to claim 7, in which the output signal of said de-emphasis circuit is fed to said first variable response amplifier, and the decoder includes a weighting circuit for weighting by a predetermined amount the input of said first variable response amplifier, and a level sensor for applying a control voltage corresponding to the output level of said decoder weighting circuit to a control voltage input terminal of said first variable response amplifier.

* * * * *